(12) United States Patent
Kagohashi et al.

(10) Patent No.: US 12,532,413 B2
(45) Date of Patent: Jan. 20, 2026

(54) PRINTED WIRING BOARD

(71) Applicant: IBIDEN CO., LTD., Gifu (JP)

(72) Inventors: Susumu Kagohashi, Ogaki (JP); Jun Sakai, Ogaki (JP); Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 158 days.

(21) Appl. No.: 18/307,886

(22) Filed: Apr. 27, 2023

(65) Prior Publication Data

US 2024/0098892 A1 Mar. 21, 2024

(30) Foreign Application Priority Data

May 25, 2022 (JP) ................ 2022-084975

(51) Int. Cl.
| | | |
|---|---|---|
| H05K 1/03 | (2006.01) | |
| H05H 1/11 | (2006.01) | |
| H05K 1/02 | (2006.01) | |
| H05K 1/11 | (2006.01) | |

(52) U.S. Cl.
CPC ......... *H05K 1/0373* (2013.01); *H05K 1/0298* (2013.01); *H05K 1/115* (2013.01); *H05K 1/03* (2013.01); *H05K 1/0313* (2013.01); *H05K 1/11* (2013.01); *H05K 1/111* (2013.01); *H05K 2201/0209* (2013.01)

(58) Field of Classification Search
CPC .... H05K 1/0373; H05K 1/0298; H05K 1/115; H05K 2201/0209; H05K 1/03; H05K 1/11
See application file for complete search history.

(56) References Cited

U.S. PATENT DOCUMENTS

| | | | | |
|---|---|---|---|---|
| 9,532,468 | B2 * | 12/2016 | Kunieda | H05K 3/4682 |
| 2009/0314526 | A1 * | 12/2009 | Nagasawa | H05K 3/381 |
| | | | | 174/262 |
| 2013/0153279 | A1 * | 6/2013 | Hayashi | H05K 3/4673 |
| | | | | 174/260 |
| 2022/0046795 | A1 * | 2/2022 | Ikeda | H05K 3/381 |
| 2022/0071016 | A1 | 3/2022 | Hwang et al. | |

FOREIGN PATENT DOCUMENTS

JP 2021-019061 A 2/2021

* cited by examiner

*Primary Examiner* — Ishwarbhai B Patel
(74) *Attorney, Agent, or Firm* — Finnegan, Henderson, Farabow, Garrett & Dunner, LLP

(57) ABSTRACT

A printed wiring board includes a first conductor layer, a resin insulating layer laminated on the first conductor layer and including resin material and inorganic particles, a second conductor layer formed on a first surface of the insulating layer such that the first conductor layer is facing a second surface of the insulating layer, and a via conductor formed in an opening extending through the insulating layer and connecting the first and second conductor layers. The insulating layer is formed such that the inorganic particles include first inorganic particles partially embedded in the resin and second inorganic particles completely embedded in the resin, the first inorganic particles have first portions protruding from the resin and second portions embedded in the resin respectively, and the first surface of the resin insulating layer includes a surface of the resin and surfaces of the first portions exposed from the surface of the resin.

20 Claims, 7 Drawing Sheets

FIG. 4F(a)
FIG. 4F(b)
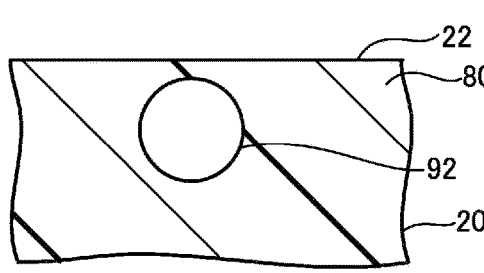
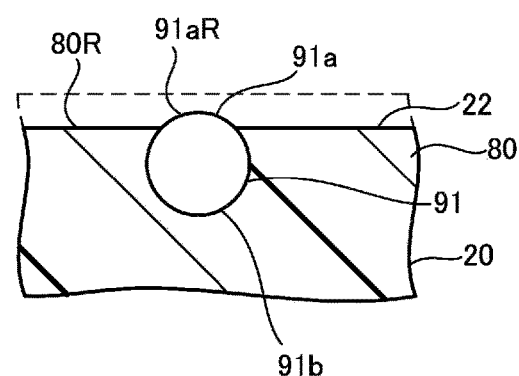
FIG. 4G
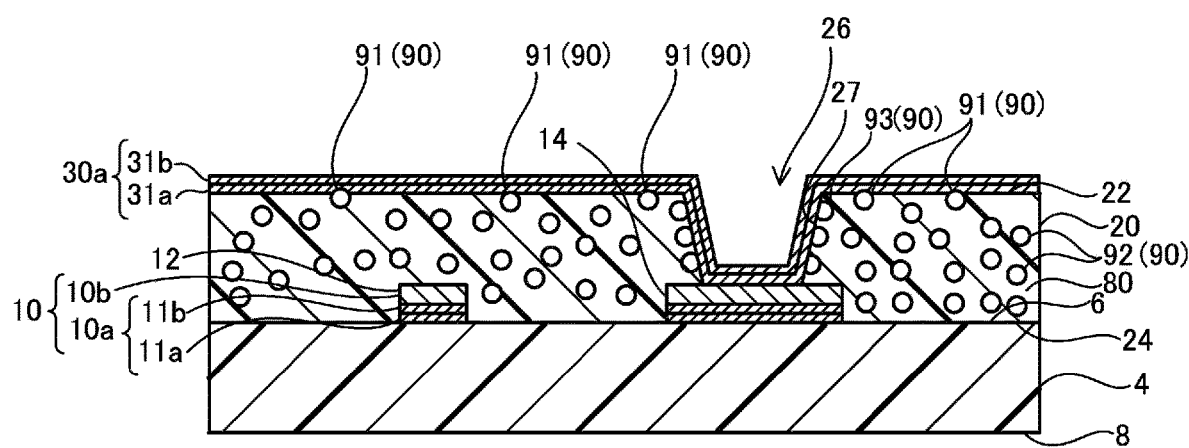

PRINTED WIRING BOARD

CROSS-REFERENCE TO RELATED APPLICATIONS

The present application is based upon and claims the benefit of priority to Japanese Patent Application No. 2022-084975, filed May 25, 2022, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2021-19061 describes a printed wiring board in which a mixture of a thermosetting resin and an inorganic filler is used as an interlayer insulating layer. The entire contents of this publication are incorporated herein by reference.

SUMMARY OF THE INVENTION

According to one aspect of the present invention, a printed wiring board includes a first conductor layer, a resin insulating layer laminated on the first conductor layer and including resin material and inorganic particles, a second conductor layer formed on a first surface of the resin insulating layer such that the first conductor layer is facing a second surface of the resin insulating layer on the opposite side with respect to the first surface, and a via conductor formed in an opening extending through the resin insulating layer such that the via conductor is connecting the first conductor layer and the second conductor layer. The resin insulating layer is formed such that the inorganic particles include first inorganic particles partially embedded in the resin and second inorganic particles completely embedded in the resin, that the first inorganic particles have first portions protruding from the resin and second portions embedded in the resin respectively, and that the first surface of the resin insulating layer includes a surface of the resin and surfaces of the first portions exposed from the surface of the resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4F(a) and 4F(b) are enlarged cross-sectional views schematically illustrating a method for manufacturing a printed wiring board according to an embodiment of the present invention;

FIG. 4G is a cross-sectional view schematically illustrating a method for manufacturing a printed wiring board according to an embodiment of the present invention.

DETAILED DESCRIPTION OF THE EMBODIMENTS

Figure 1:
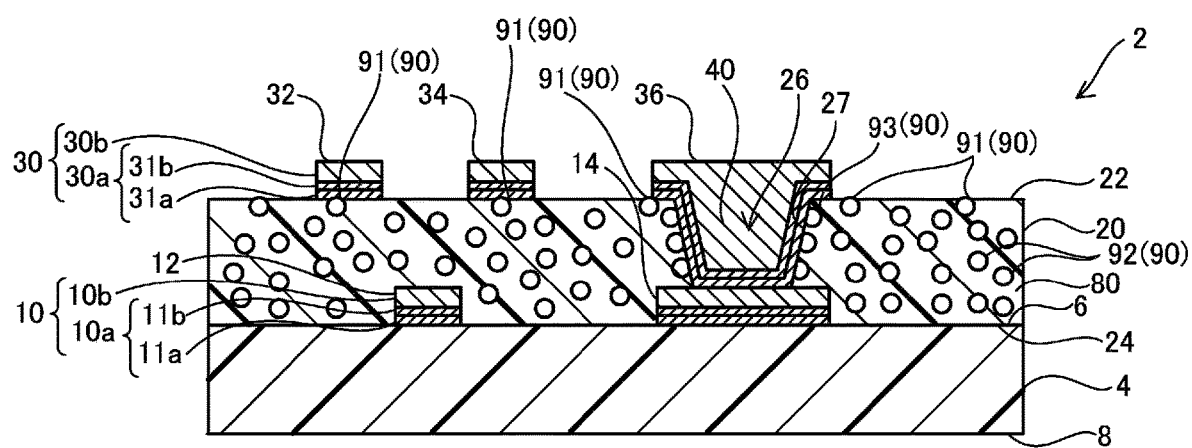
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

EMBODIMENT

Figure 2:
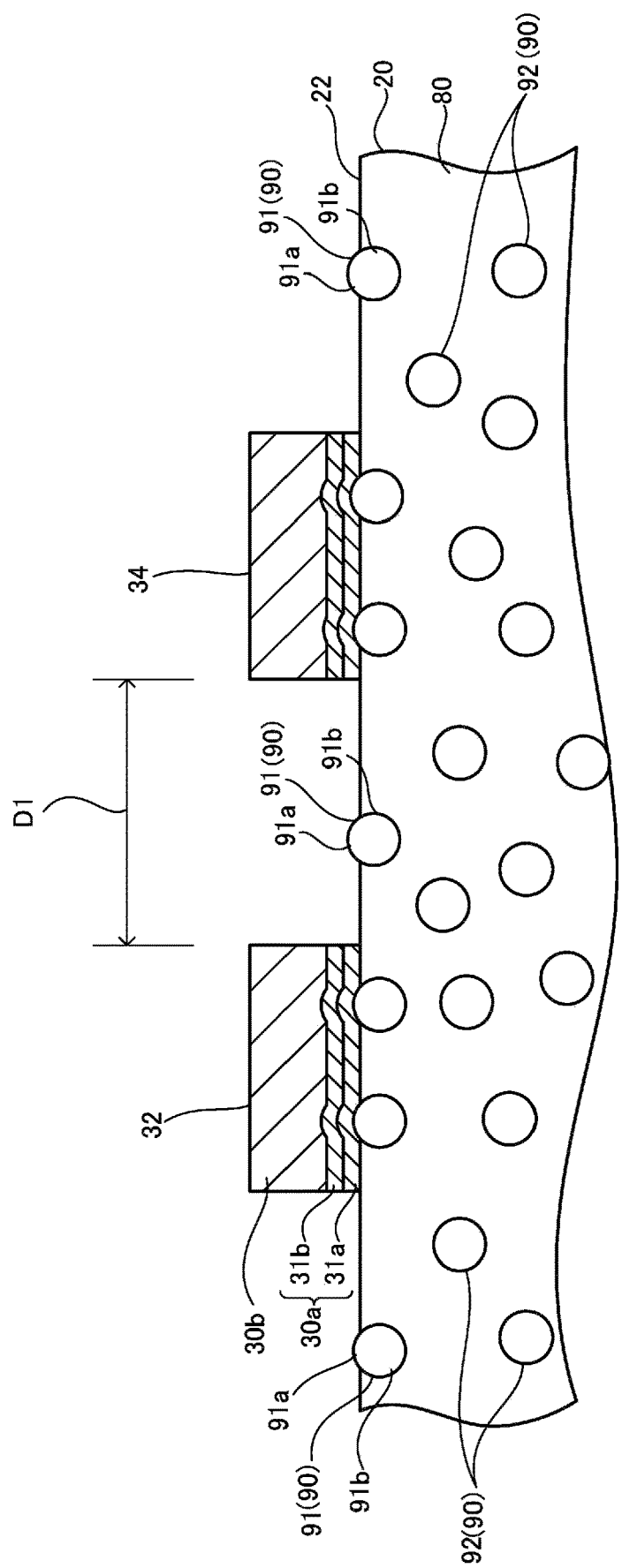
FIG. 2 is an enlarged cross-sectional view schematically illustrating a part of a printed wiring board according to an embodiment of the present invention.
Figure 3:
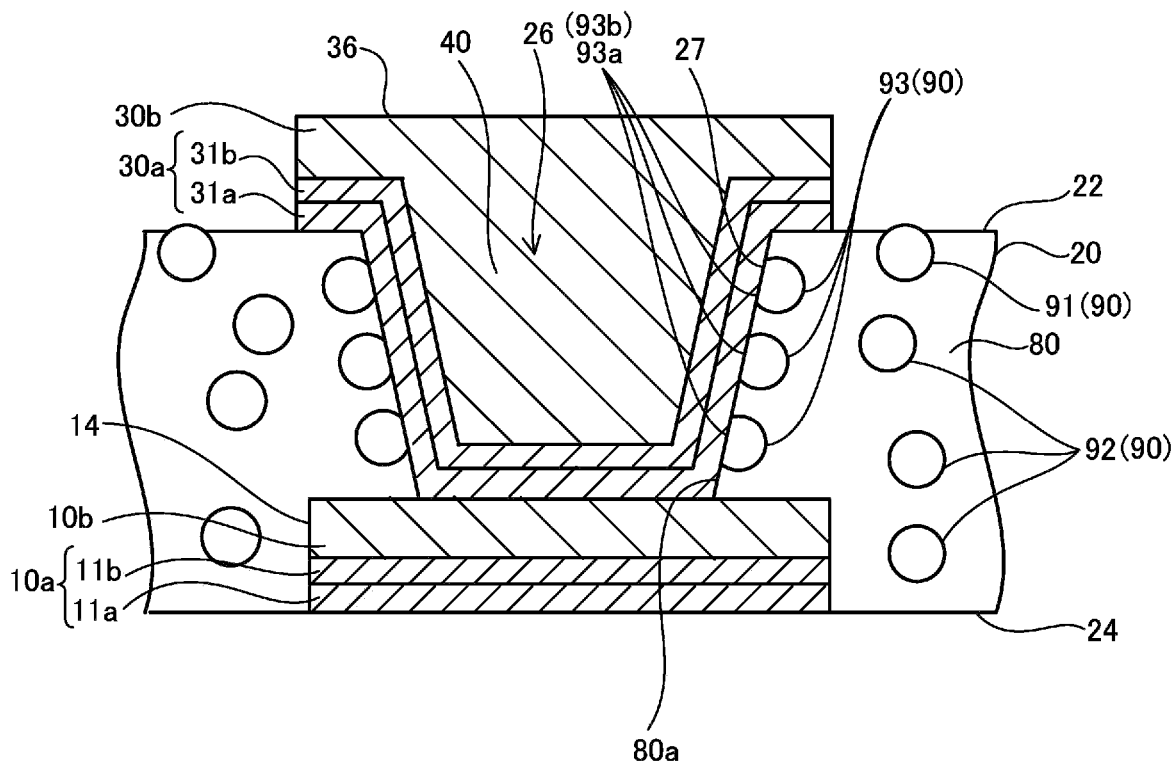
FIG. 3 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIGS. 2 and 3 are each an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) has a thickness of less than 0.5 μm. The seed layer (10a) is formed by a first layer (11a) on the third surface 6 and a second layer (11b) on the first layer (11a). A ratio of a thickness of the first layer (11a) to a thickness of the second layer (11b) ((the thickness of the first layer)/(the thickness of the second layer)) is 0.25 or more and 0.7 or less. The second layer (11b) is thicker than the first layer (11a). The first layer (11a) is formed of an alloy (copper alloy) containing copper and a specific base metal. A specific base metal is a base metal other than copper. The specific base metal is, for example, aluminum. The second layer (11b) is formed of copper. The electrolytic plating layer (10b) is formed of copper. The first layer (11a) is in contact with the insulating layer 4.

A content of copper in the copper alloy forming the first layer (11a) is greater than 90 at %. The content of copper in the copper alloy of the first layer (11a) is less than 99 at %. The content of copper in the copper alloy is 98 at % or less. A content of copper forming the second layer (11b) is 99.9 at % or more. The content of copper in the second layer (11b) is preferably 99.95 at % or more.

The resin insulating layer 20 is formed on the third surface 6 of the insulating layer 4 and on the first conductor layer 10. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 has an opening 26 that expose the pad 14. The opening 26 has a bottom diameter of 20 µm or more and 50 µm or less. The resin insulating layer 20 is formed of a resin 80 and a large number of inorganic particles 90 dispersed in the resin 80. The resin 80 is an epoxy resin. Examples of the resin include a thermosetting resin and a photocurable resin. Examples of the inorganic particles 90 include silica particles and alumina particles. The inorganic particles 90 have an average particle size of 0.5 µm or less. An amount of the inorganic particles 90 in the resin insulating layer 20 is 70 wt % or more.

As illustrated in FIGS. 1 and 2, the inorganic particles 90 include first inorganic particles 91 that are partially embedded in the resin 80 and second inorganic particles 92 that are embedded in the resin 80. The first inorganic particles 91 and the second inorganic particles 92 have spherical shapes. As illustrated in FIG. 2, the first inorganic particles 91 are each formed of a first portion (91a) protruding from the resin 80 and a second portion (91b) embedded in the resin 80. The first surface 22 of the resin insulating layer 20 is formed by an upper surface of the resin 80 and exposed surfaces of the first portions (91a) exposed from the upper surface of the resin 80.

A ratio (R) of a volume of each of the first portions (91a) to a volume of each of the first inorganic particles 91 ((the volume of each of the first portions)/(the volume of each of the first particles)) is greater than 0 and less than or equal to 0.4. The ratio (R) is preferably 0.2 or less. The ratio (R) is more preferably 0.1 or less. The ratio (R) is most preferably 0.05 or less. When the first portions (91a) protrude from the resin 80, the first surface 22 of the resin insulating layer 20 has a slight unevenness. However, the upper surface of the resin 80 is not roughened. Therefore, the first surface 22 has substantially no recesses. The first surface 22 has an arithmetic mean roughness (Ra) of less than 0.08 µm. The arithmetic mean roughness (Ra) of the first surface 22 is preferably 0.05 µm or less. The arithmetic mean roughness (Ra) of the first surface 22 is more preferably 0.03 µm or less.

As illustrated in FIGS. 1 and 3, the inorganic particles 90 further include third inorganic particles 93 that form an inner wall surface 27 of the opening 26. The third inorganic particles 93 each have a shape obtained by cutting a sphere with a plane. The third inorganic particles 93 each have a shape obtained by cutting a second inorganic particle 92 with a plane. The third inorganic particles 93 and the second inorganic particles 92 are different in shape. The third inorganic particles 93 each have a flat part (93a). The flat parts (93a) form the inner wall surface 27. The inner wall surface 27 is formed of the resin 80 and the flat parts (93a). The flat parts (93a) and a surface of the resin 80 that forms the inner wall surface 27 form substantially a common surface. No unevenness is formed on the resin 80 that forms the inner wall surface 27. The surface of the resin 80 that forms the inner wall surface 27 is substantially smooth. No unevenness is formed on exposed surfaces of the flat parts (93a) (surfaces that form the inner wall surface 27). The exposed surfaces of the flat parts (93a) are smooth. The inner wall surface 27 is formed smooth. The inner wall surface 27 has an arithmetic mean roughness (Ra) of 1.0 µm or less.

As illustrated in FIG. 1, the second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The first signal wiring 32 and the second signal wiring 34 are adjacent to each other. As illustrated in FIG. 2, a distance (D1) between the first signal wiring 32 and the second signal wiring 34 is 1.5 µm or more and µm or less. The distance (D1) is preferably 1.5 µm or more and 8 µm or less. The first signal wiring 32 and the second signal wiring 34 are examples of a "first conductor circuit" and a "second conductor circuit."

The second conductor layer 30 is mainly formed of copper. The second conductor layer 30 is formed by a seed layer (30a) on the first surface 22 and an electrolytic plating layer (30b) on the seed layer (30a). The seed layer (30a) is formed by a first layer (31a) on the first surface 22 and a second layer (31b) on the first layer (31a). The seed layer (30a) has a thickness of less than 0.5 A relationship between the thickness of the first layer (31a) and the thickness of the second layer (31b) is the same as the relationship between the thickness of the first layer (11a) and the thickness of the second layer (11b). The first layer (31a) and the second layer (31b) form the second conductor layer 30, and the first layer (11a) and the second layer (11b) form the first conductor layer 10. The first layer (31a) is formed of an alloy (copper alloy) containing copper and a specific base metal. A specific base metal is a base metal other than copper. The specific base metal is, for example, aluminum. The second layer (31b) is formed of copper. The electrolytic plating layer (30b) is formed of copper. The first layer (31a) is in contact with the first surface 22.

A content of copper in the copper alloy forming the first layer (31a) is greater than 90 at %. The content of copper in the copper alloy of the first layer (31a) is less than 99 at %. The content of copper in the copper alloy is 98 at % or less. A content of copper forming the second layer (31b) is 99.9 at % or more. The content of copper in the second layer (31b) is preferably 99.95 at % or more.

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (30a) and an electrolytic plating layer (30b) on the seed layer (30a). The seed layer (30a) forming the via conductor 40 and the seed layer (30a) forming the second conductor layer are the same. The first layer (31a) is in contact with the inner wall surface 27.

Although not illustrated in the drawings, each side of the printed wiring board 2 has a length of 50 mm or more. The length of each side is preferably 100 mm or more. The length of each side is 250 mm or less.

Method for Manufacturing Printed Wiring Board

Figure 4A:
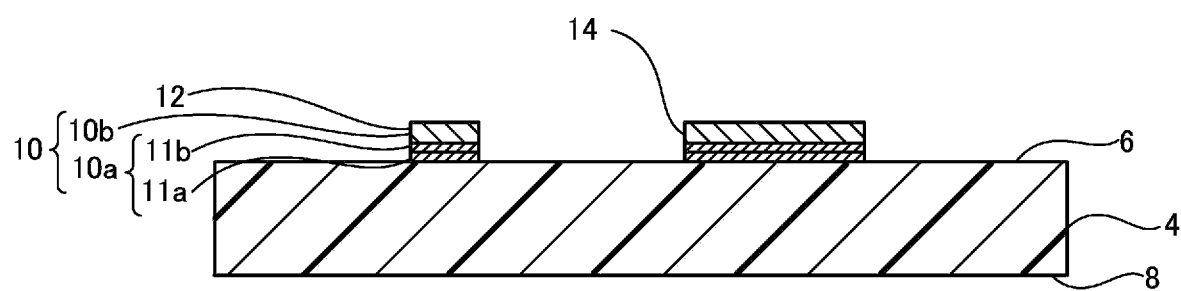
FIG. 4A is a cross-sectional view schematically illustrating a method for manufacturing a printed wiring board according to an embodiment of the present invention.
Figure 4B:
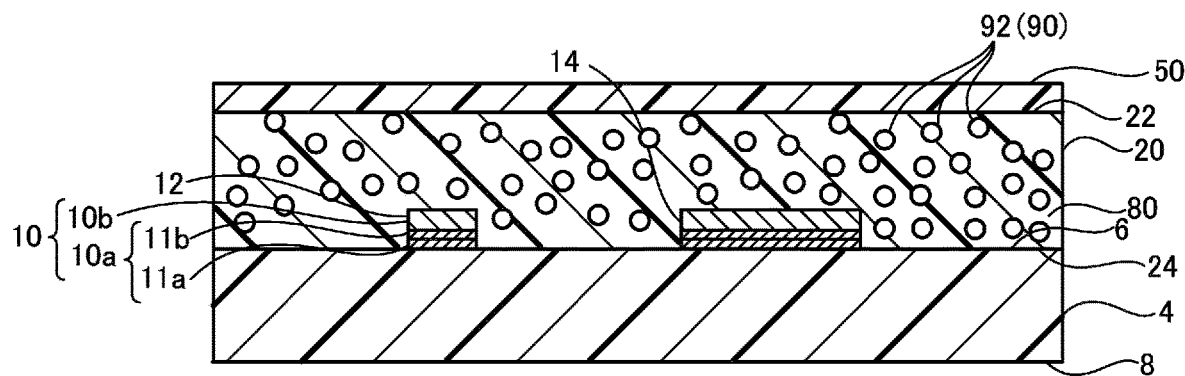
FIG. 4B is a cross-sectional view schematically illustrating a method for manufacturing a printed wiring board according to an embodiment of the present invention.
Figure 4C:
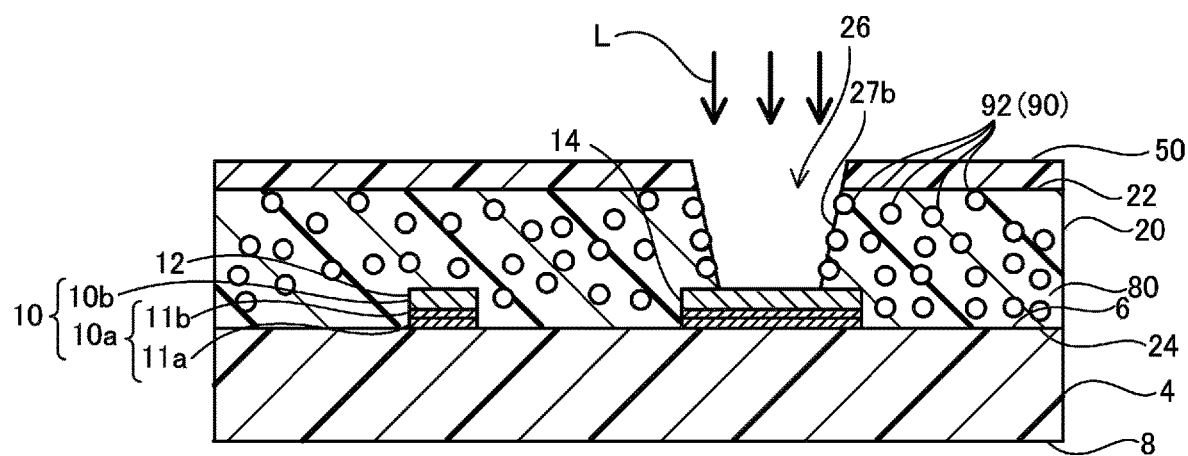
FIG. 4C is a cross-sectional view schematically illustrating a method for manufacturing a printed wiring board according to an embodiment of the present invention.
Figure 4D:
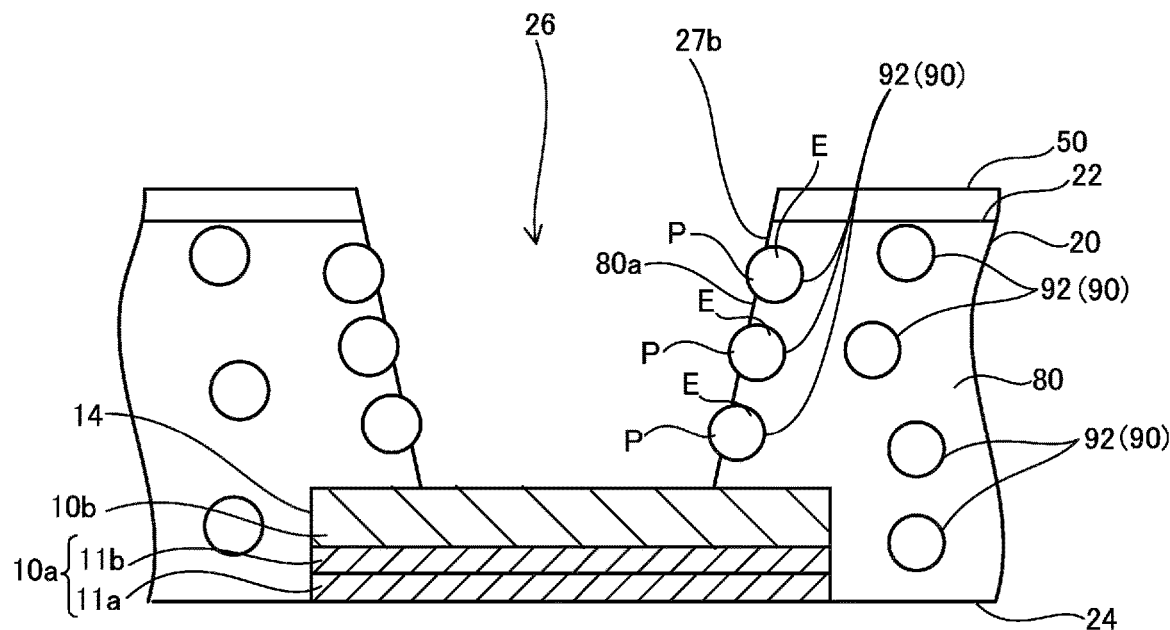
FIG. 4D is an enlarged cross-sectional view schematically illustrating a method for manufacturing a printed wiring board according to an embodiment of the present invention.

FIGS. 4A-4G illustrate a method for manufacturing the printed wiring board 2 of the embodiment according to an embodiment of the present invention. FIGS. 4A-4C, 4E, and 4G are cross-sectional views. FIGS. 4D and 4F are enlarged cross-sectional views. FIG. 4A illustrates the insulating layer 4 and the first conductor layer 10 formed on the third surface 6 of the insulating layer 4. The first conductor layer 10 is formed using a semi-additive method. The first layer (11a) and second layer (11b) are formed by sputtering. The first layer (11a) and the second layer (11b) are formed in vacuum. The electrolytic plating layer (10b) is formed by electrolytic plating.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 has the resin 80 and the inorganic particles 90 (the second inorganic particles 92). The inorganic particles 90 are embedded in the resin 80.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer is formed. The laser (L) is, for example, UV laser, or CO2 laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 4D illustrates an inner wall surface (27b) of the opening 26 after the laser irradiation. The inner wall surface (27b) is formed of the resin 80 and the inorganic particles 90 protruding from the resin 80. In order to control the shape of the inner wall surface, the inner wall surface (27b) after the laser irradiation is treated. It is preferable to selectively remove the inorganic particles 90 protruding from the resin 80. As a result, the third inorganic particles 93 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the third inorganic particles 93 having the flat parts (93a) (see FIG. 3) are obtained. By controlling conditions for treating the inner wall surface (27b) after the laser irradiation, a shape of the inner wall surface 27 can be controlled. Examples of the conditions are a temperature, a concentration, a time, a type of gas, and a pressure. The etching rate of the inorganic particles 90 and the etching rate of the resin are controlled.

By irradiating the resin insulating layer 20 with the laser (L), some of the second inorganic particles 92 embedded in the resin 80 form the inner wall surface (27b) after the laser irradiation. The second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 (FIGS. 1 and 3) of the embodiment. The third inorganic particles 93 are formed from the second inorganic particles 92. By selectively removing the protruding portions (P), the third inorganic particles 93 having the flat parts (93a) are formed. The flat parts (93a) are flat surfaces. When the second inorganic particles 92 having spherical shapes are cut along a plane, the shapes of the third inorganic particles 93 are obtained. The inner wall surface 27 is formed of the flat parts (93a) and a surface (80a) of the resin 80. Exposed surfaces (93b) of the flat parts (93a) and the surface (80a) of the resin 80 are positioned substantially on the same plane. For example, when the seed layer (30a) is formed on the inner wall surface (27b) by sputtering, the protruding portions (P) inhibit growth of a sputtering film. For example, a continuous seed layer (30a) is not formed on the inner wall surface (27b). Or the seed layer (30a) is increased in thickness. A fine conductor circuit cannot be formed. In the embodiment, the projecting portions (P) are removed. The seed layer (30a) formed by sputtering can be reduced in thickness. Even when the seed layer (30a) formed by sputtering is thin, a continuous seed layer (30a) is obtained. The seed layer (30a) has a thickness of 0.05 μm or more and less than 0.5 μm.

No unevenness is formed on the inner wall surface 27. The inner wall surface 27 is formed smooth. By controlling the conditions for treating the inner wall surface (27b) after the laser irradiation, a size of unevenness is controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. The cleaning includes a desmear treatment. The first surface 22 of the resin insulating layer 20 is covered by the protective film 50, and thus, is not affected by the plasma. At this point, no unevenness is formed on the first surface 22 of the resin insulating layer 20. The inorganic particles 90 are not exposed on the first surface 22. The first surface 22 is not roughened.

When treating the inner wall surface (27b) after the laser irradiation includes cleaning the inside of the opening 26, cleaning the inside of the opening 26 may be omitted.

Figure 4E:
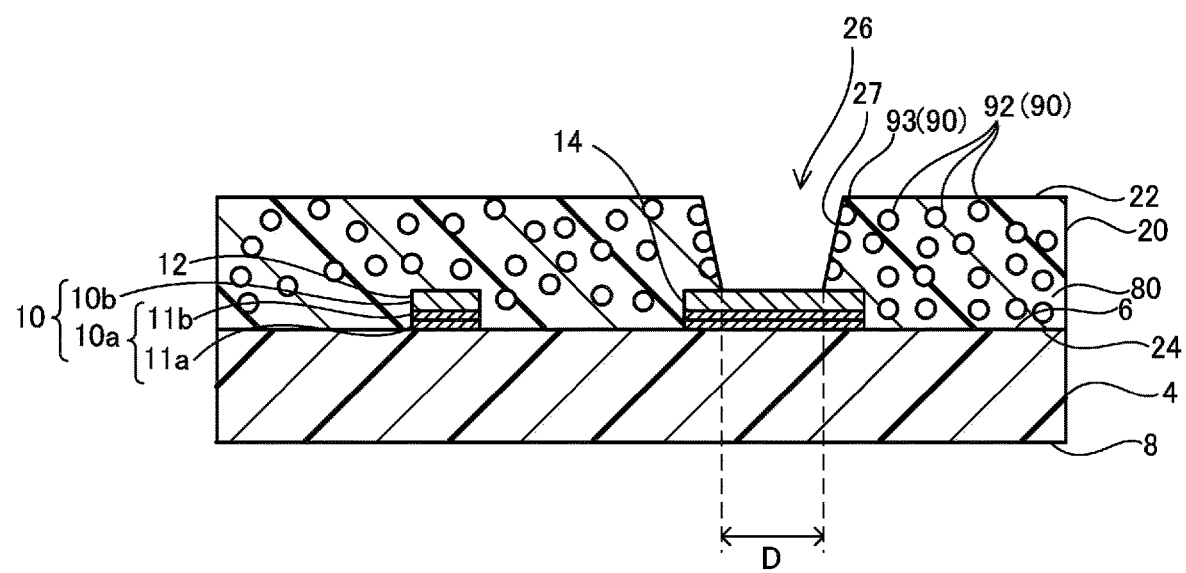
FIG. 4E is a cross-sectional view schematically illustrating a method for manufacturing a printed wiring board according to an embodiment of the present invention.

As illustrated in FIG. 4E, after cleaning the inside of the opening 26, the protective film 50 is removed from the resin insulating layer 20. When treating the inner wall surface (27b) after the laser irradiation includes cleaning the inside of the opening 26, the protective film 50 is removed from the resin insulating layer 20 after treating the inner wall surface (27b) after the laser irradiation. When the inner wall surface (27b) after the laser irradiation is treated, the protective film 50 covers the first surface 22 of the resin insulating layer 20.

After removing the protective film 50, the first surface 22 of the resin insulating layer 20 is cleaned. The first surface 22 is dry etched. The dry etching is performed by sputtering using argon gas (argon sputtering). FIGS. 4F(a) and 4F(b) schematically illustrate the first surface 22 of the resin insulating layer 20 before and after the dry etching. As illustrated in FIGS. 4F(a) and 4F(b), about 20 nm of the resin 80 forming the resin insulating layer 20 is removed by the dry etching. For example, an adhesive used to adhere the protective film 50 to the resin insulating layer 20 is removed. By the dry etching, the resin 80 is selectively removed. The resin 80 is reduced in thickness. Some of the inorganic particles 90 (the second inorganic particles 92) are partially exposed from the upper surface of the resin 80 by the dry etching. The first inorganic particles 91 are obtained by exposing the second inorganic particles 92 embedded in the resin 80 from the upper surface of the resin 80. The first inorganic particles 91 are formed from the second inorganic particles 92. The first inorganic particles 91 and the second inorganic particles 92 have the same shape. Both have a spherical shape. As illustrated in FIG. 4F(b), the first inorganic particles 91 are each formed of a first portion (91a) protruding from the resin 80 and a second portion (91b) embedded in the resin 80. The first surface 22 of the resin insulating layer 20 is formed by an upper surface (80R) of the resin 80 and exposed surfaces (91aR) of the first portions (91a) protruding from the upper surface (80R) of the resin 80. The exposed surfaces (91aR) of the first portions (91a) are exposed by the dry etching. The first surface 22 of the resin insulating layer 20 is not roughened. Therefore, substantially no recesses are formed on the first surface 22.

The ratio (R) is calculated, for example, using the cross-sectional view of the first inorganic particles 91 illustrated in FIG. 4F(b). FIG. 4F(b) is obtained by cutting the resin insulating layer 20 in a plane perpendicular to the upper surface (80R). In FIG. 4F(b), the second conductor layer 30 is omitted. The second conductor layer 30 is formed on the first inorganic particles 91 in FIG. 4F(b). The exposed surfaces (91aR) in FIG. 4F(b) are covered by the second conductor layer 30. Using FIG. 4F(b), a cross-sectional area (91aS) of the first portions (91a) is obtained. Similarly, a cross-sectional area (91S) of the first inorganic particles 91 is obtained. For example, the ratio (R) is represented by a ratio of the cross-sectional area (91aS) to the cross-sectional area (91S) ((the cross-sectional area (91aS) of the first portions (91a))/(the cross-sectional area (91S) of the first inorganic particles 91)). For example, 50 first inorganic particles 91 are observed when the ratio (R) is evaluated. Fifty first inorganic particles 91 satisfy the ratio (R).

As illustrated in FIG. 4G, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22 by sputtering. At the same time, the first layer (31a) is formed on the inner wall surface 27 and the pad 14, which are exposed from the opening 26, by sputtering. Substantially no recesses are formed on the first surface 22. Therefore, the first layer (31a) on the first surface 22 is formed substantially flat. After that, the second layer (31b) is formed on the first layer (31a) by sputtering. The second layer (31b) is formed substantially flat. The first layer (31a) and the second layer (31b) are formed in vacuum. The seed layer (30a) is also formed on the upper surface of the pad 14 exposed from the opening 26 and on the inner wall surface 27 of the opening 26. The first layer (31a) is formed of an alloy containing copper and a specific base metal (aluminum). The second layer (31b) is formed of copper.

The first surface 22 has no recesses. The inner wall surface 27 is formed smooth. Therefore, even when the sputtering films (the first layer (31a) and the second layer (31b)) are thin, a continuous seed layer (30a) is formed. As a result, fine wirings can be formed.

A plating resist (not illustrated in the drawings) is formed on the seed layer (30a). The plating resist has openings for forming the first signal wiring 32, the second signal wiring 34, and the land 36 (FIG. 1). When the first surface 22 has recesses, air caused by the recesses is likely to be trapped between the plating resist and the seed layer (30a). However, in the embodiment, the first surface 22 has substantially no recesses. Therefore, the seed layer (30a) on the first surface 22 is formed substantially flat. The seed layer (30a) has substantially no recesses. Air is unlikely to remain between the plating resist and the seed layer (30a). A contact area between the plating resist and the seed layer (30a) is large. Even when a width of the plating resist for forming a space between the first signal wiring 32 and the second signal wiring 34 is 10 μm or less, the plating resist is unlikely to peel off from an upper surface of the seed layer (30a). According to the embodiment, even when the width of the plating resist is 3 μm or more and 8 μm or less, the plating resist can be formed on the seed layer (30a). Even when the width of the plating resist is 6 μm or less, the plating resist is unlikely to peel off from the seed layer (30a).

The electrolytic plating layer (30b) is formed on the seed layer (30a) exposed from the plating resist. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

The plating resist is removed. The seed layer (30a) exposed from the electrolytic plating layer (30b) is removed. The seed layer (30a) is removed by wet etching. An etching solution used for the wet etching is an aqueous solution containing hydrogen peroxide and sulfuric acid. By the wet etching, the first layer (31a) and the second layer (31b) are removed at the same time. The second conductor layer 30 and the via conductor are formed at the same time. The printed wiring board 2 (FIG. 1) of the embodiment is obtained.

In the printed wiring board 2 of the embodiment (FIGS. 1-3), the first surface 22 of the resin insulating layer 20 is formed by the upper surface (80R) of the resin 80 and the exposed surfaces (91aR) of the first portions (91a) exposed from the upper surface (80R) of the resin 80. The first surface 22 has no recesses. Therefore, when the seed layer (30a) is formed on the resin insulating layer 20 by sputtering, a continuous seed layer (30a) can be formed even when the sputtering films are thin. The seed layer (30a) is formed thin. When the seed layer (30a) is removed, an etching amount is small. Therefore, an etching amount of the electrolytic plating layer (30b) is small. The second conductor layer 30 having the first signal wiring 32 and the second signal wiring 34 has widths as designed. Fine wirings are formed. A high quality printed wiring board 2 is provided.

In the printed wiring board 2 of the embodiment, the inner wall surface 27 of the opening 26 is formed by the flat parts (93a) of the third inorganic particles 93 and the resin 80. The flat parts (93a) and the surface (80a) of the resin 80 forming the inner wall surface 27 form a common surface. The inner wall surface 27 is formed smooth. Therefore, the seed layer (30a) having a uniform thickness is formed on the inner wall surface 27 of the opening 26. The seed layer (30a) is formed thin (FIG. 4G). When the seed layer (30a) is removed, an etching amount is small. Therefore, an etching amount of the electrolytic plating layer (30b) is small. The second conductor layer 30 having the first signal wiring 32 and the second signal wiring 34 has widths as designed. Fine wirings are formed. A high quality printed wiring board 2 is provided.

In the printed wiring board 2 of the embodiment, the first layer (31a) and the second layer (31b) of the seed layer (30a) are formed by sputtering (FIG. 4G). Since the sputtering is performed in a vacuum, oxidation of the first layer (31a) is unlikely to occur when the second layer (31b) is formed. The first layer (31a) and the second layer (31b) are sufficiently adhered to each other. The second layer (31b) is unlikely to peel off from the first layer (31a). Even when the opening 26 has a small diameter, connection reliability between the via conductor 40 and the pad 14 is high. Connection resistance via the via conductor 40 is unlikely to increase. As illustrated in FIG. 4E, a diameter (D) of the via conductor 40 (the diameter of the opening 26) is measured on the pad 14. The diameter (D) is 20 μm or more and 50 μm or less. Even when the length of each side of the printed wiring board 2 exceeds 50 mm, the connection resistance via the via conductor 40 is unlikely to increase. Even when the length of each side of the printed wiring board 2 is 100 mm or more, the connection resistance is unlikely to increase for a long period of time. A high quality printed wiring board 2 is provided.

First Alternative Example

In a first alternative example of the embodiment, the specific base metal is selected from titanium, nickel, chromium, tin and calcium.

Second Alternative Example

In a second alternative example of the embodiment, the first layers (11a, 31a) of the seed layers (10a, 30a) are each formed of copper and a second element. The second element is selected from silicon, aluminum, titanium, nickel, chromium, carbon, oxygen, tin, and calcium. The first layers (11a, 31a) are each formed of an alloy containing copper. The second layers (11b, 31b) are each formed of copper. An amount of copper forming each of the second layers (11b, 31b) is 99.9 at % or more, and preferably 99.95 at % or more.

Modified Embodiment

Figure 5:
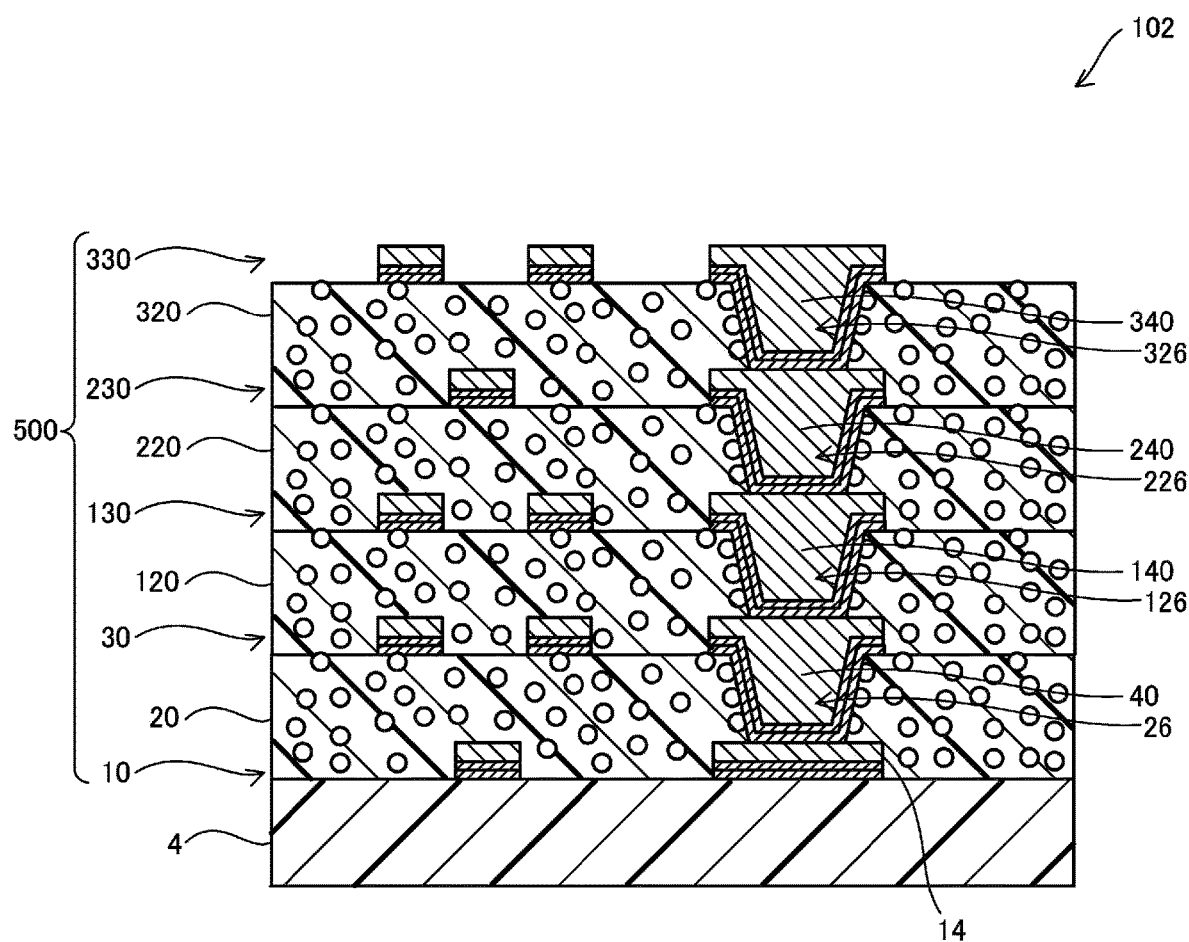
FIG. 5 is a cross-sectional view schematically illustrating a printed wiring board of a modified embodiment of the embodiment.

FIG. 5 illustrates a modified embodiment of the embodiment. As illustrated in FIG. 5, a printed wiring board 102 of the modified embodiment has a build-up layer 500 on the insulating layer 4. The buildup layer 500 includes multiple conductor layers and multiple resin insulating layers. The conductor layers and the resin insulating layers are alternately laminated. The build-up layer 500 includes five conductor layers and four resin insulating layers. The five conductor layers include a first conductor layer 10, a second conductor layer 30, a third conductor layer 130, a fourth conductor layer 230, and a fifth conductor layer 330. The first conductor layer 10 and the second conductor layer 30 are the same as those in the embodiment. The third conductor layer 130, the fourth conductor layer 230, and the fifth conductor layer 330 each have the same structure (a seed layer and an electrolytic plating layer) as the second conductor layer 30. The third conductor layer 130, the fourth conductor layer 230, and the fifth conductor layer 330 are each formed using the same method as that for the second conductor layer 30.

The four resin insulating layers include a first resin insulating layer 20, a second resin insulating layer 120, a third resin insulating layer 220, and a fourth resin insulating layer 320. The first resin insulating layer 20 is the same as the resin insulating layer 20 of the embodiment. The second resin insulating layer 120, the third resin insulating layer 220, and the fourth resin insulating layer 320 have the same structure (the resin and the inorganic particles) as the first resin insulating layer 20. The first resin insulating layer 20, the second resin insulating layer 120, the third resin insulating layer 220, and the fourth resin insulating layer 320 are formed using the same method as that for the resin insulating layer 20 of the embodiment. The first resin insulating layer 20, the second resin insulating layer 120, the third resin insulating layer 220, and the fourth resin insulating layer 320 respectively have openings (26, 126, 226, 326).

The buildup layer 500 has four via conductors (40, 140, 240, 340). The via conductor 40 is formed in the opening 26 and connects the first conductor layer 10 and the second conductor layer 30. The via conductor 140 is formed in the opening 126 and connects the second conductor layer 30 and the third conductor layer 130. The via conductor 240 is formed in the opening 226 and connects the third conductor layer 130 and the fourth conductor layer 230. The via conductor 340 is formed in the opening 326 and connects the fourth conductor layer 230 and the fifth conductor layer 330. The three via conductors (140, 240, 340) are laminated directly above the via conductor 40. The four via conductors (40, 140, 240, 340) form a stacked via.

The printed wiring board 102 of the modified embodiment includes the five conductor layers (10, 30, 130, 230, 330) and the stacked via formed by the four via conductors (40, 140, 240, 340). As the printed wiring board 102 is used, a large stress is applied to a connecting portion between the lowermost via conductor 40 and the first conductor layer 10 (the pad 14). However, in the modified embodiment, connection reliability between the via conductor 40 and the first conductor layer 10 (the pad 14) is high. Connection resistance via the via conductor 40 is unlikely to increase.

Alternative Example of Modified Embodiment

The buildup layer 500 has five or more conductor layers. The buildup layer 500 preferably has ten or more conductor layers. The number of the conductor layers is 20 or less.

Japanese Patent Application Laid-Open Publication No. 2021-19061 describes a printed wiring board in which a mixture of a thermosetting resin and an inorganic filler is used as an interlayer insulating layer. In Japanese Patent Application Laid-Open Publication No. 2021-19061, a surface of the interlayer insulating layer and a side surface of a via are formed as rough surfaces having recesses.

When a seed layer is formed by sputtering on an interlayer insulating layer formed using the technology of Japanese Patent Application Laid-Open Publication No. 2021-19061, it is thought that it is difficult to form a continuous seed layer. For example, it is thought that in order to form a continuous film, a sputtering film is increased in thickness. However, when a seed layer is thick, it is thought that an etching amount required to remove the seed layer is large. It is thought that it is difficult to form a fine wiring.

A printed wiring board according to an embodiment of the present invention includes: a first conductor layer; a resin insulating layer that has a first surface and a second surface on the opposite side with respect to the first surface, an opening extending from the first surface to the second surface, and is laminated on the first conductor layer such that the second surface faces the first conductor layer; a second conductor layer that is formed on the first surface of the resin insulating layer; and a via conductor that is formed in the opening and connects the first conductor layer and the second conductor layer. The resin insulating layer contains a resin and inorganic particles. The inorganic particles include first inorganic particles that are partially embedded in the resin and second inorganic particles that are completely embedded in the resin. The first inorganic particles are each formed of a first portion protruding from the resin and a second portion embedded in the resin. The first surface is formed by an upper surface of the resin and exposed surfaces of the first portions exposed from the upper surface.

In a printed wiring board according to an embodiment of the present invention, substantially no recesses are formed on the first surface of the resin insulating layer. Therefore, when a seed layer is formed by sputtering on the resin insulating layer, a continuous seed layer is formed even when a sputtering film is thin. As a result, when the seed layer is removed, an etching amount is reduced. Fine wirings are formed.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer laminated on the first conductor layer and comprising resin material and inorganic particles;
a second conductor layer formed on a first surface of the resin insulating layer such that the first conductor layer is facing a second surface of the resin insulating layer on an opposite side with respect to the first surface; and
a via conductor formed in an opening extending through the resin insulating layer such that the via conductor is connecting the first conductor layer and the second conductor layer,
wherein the resin insulating layer is formed such that the inorganic particles include first inorganic particles partially embedded in the resin material and second inorganic particles completely embedded in the resin material, that the first inorganic particles have first portions protruding from a surface of the resin material and second portions embedded in the resin material respectively, that the first surface of the resin insulating layer includes the surface of the resin material and surfaces of the first portions exposed from the surface of the resin material, and that a ratio of a volume of the first portions to a volume of the first inorganic particles is greater than 0 and less than or equal to 0.4, and the second conductor layer and the via conductor include a seed layer and an electrolytic plating layer formed on the seed layer such that the seed layer has a thickness of less than 0.5 μm and that the seed layer of the second conductor layer includes a first layer formed by sputtering on the first surface of the resin insulating layer and a second layer formed by sputtering on the first layer and having a thickness that is greater than a thickness of the first layer.

2. The printed wiring board according to claim 1, wherein the resin insulating layer is formed such that the surface of the resin material is not roughened.

3. The printed wiring board according to claim 2, wherein the resin insulating layer is formed such that the first surface has an arithmetic mean roughness Ra of less than 0.08 μm.

4. The printed wiring board according to claim 2, wherein the resin insulating layer is formed such that the inorganic particles further include third inorganic particles that have flat parts and form an inner wall surface in the opening and that the inner wall surface includes the flat parts of the third inorganic particles and a surface of the resin material.

5. The printed wiring board according to claim 4, wherein the resin insulating layer is formed such that the inner wall surface has an arithmetic mean roughness Ra of 1.0 μm or less.

6. The printed wiring board according to claim 2, wherein the second conductor layer includes a first conductor circuit and a second conductor circuit formed adjacent to the first conductor circuit such that a distance between the first conductor circuit and the second conductor circuit is in a range of 1.5 μm to 10 μm.

7. The printed wiring board according to claim 1, wherein the resin insulating layer is formed such that the ratio is 0.2 or less.

8. The printed wiring board according to claim 7, wherein the resin insulating layer is formed such that the ratio is 0.1 or less.

9. The printed wiring board according to claim 8, wherein the resin insulating layer is formed such that the ratio is 0.05 or less.

10. The printed wiring board according to claim 1, wherein the resin insulating layer is formed such that the first surface has an arithmetic mean roughness Ra of less than 0.08 μm.

11. The printed wiring board according to claim 10, wherein the resin insulating layer is formed such that the first surface has an arithmetic mean roughness Ra of 0.05 μm or less.

12. The printed wiring board according to claim 11, wherein the resin insulating layer is formed such that the first surface has an arithmetic mean roughness Ra of 0.03 μm or less.

13. The printed wiring board according to claim 1, wherein the resin insulating layer is formed such that the inorganic particles further include third inorganic particles that have flat parts and form an inner wall surface in the opening and that the inner wall surface includes the flat parts of the third inorganic particles and a surface of the resin material.

14. The printed wiring board according to claim 13, wherein the resin insulating layer is formed such that the inner wall surface has an arithmetic mean roughness Ra of 1.0 μm or less.

15. The printed wiring board according to claim 13, wherein the resin insulating layer is formed such that the third inorganic particles have shapes obtained by cutting a portion of a sphere along a plane of the inner wall surface.

16. The printed wiring board according to claim 15, wherein the resin insulating layer is formed such that the third inorganic particles are a group of the second inorganic particles cut along a plane of the inner wall surface.

17. The printed wiring board according to claim 1, wherein the second conductor layer includes a first conductor circuit and a second conductor circuit formed adjacent to the first conductor circuit such that a distance between the first conductor circuit and the second conductor circuit is in a range of 1.5 µm to 10 µm.

18. The printed wiring board according to claim 1, wherein the second conductor layer includes a first conductor circuit and a second conductor circuit formed adjacent to the first conductor circuit such that a distance between the first conductor circuit and the second conductor circuit is in a range of 1.5 µm to 8 µm.

19. The printed wiring board according to claim 1, wherein the resin insulating layer is formed such that the first surface has substantially no recesses.

20. The printed wiring board according to claim 1, wherein the second conductor layer is formed such that the thickness of the seed layer is 0.05 µm or greater.

* * * * *